(12) United States Patent
Sunohara et al.

(10) Patent No.: US 9,392,705 B2
(45) Date of Patent: Jul. 12, 2016

(54) WIRING BOARD WITH THROUGH WIRING

(71) Applicant: SHINKO ELECTRIC INDUSTRIES CO., LTD., Nagano (JP)

(72) Inventors: Masahiro Sunohara, Nagano (JP); Yuichiro Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 69 days.

(21) Appl. No.: 14/471,209

(22) Filed: Aug. 28, 2014

(65) Prior Publication Data

US 2015/0083469 A1 Mar. 26, 2015

(30) Foreign Application Priority Data

Sep. 26, 2013 (JP) .................. 2013-200631

(51) Int. Cl.
| | |
|---|---|
| H05K 3/42 | (2006.01) |
| H01L 23/48 | (2006.01) |
| H01L 21/768 | (2006.01) |
| H01L 23/14 | (2006.01) |
| H01L 23/15 | (2006.01) |
| H01L 21/288 | (2006.01) |
| H01L 23/498 | (2006.01) |
| H01L 21/48 | (2006.01) |
| H05K 1/03 | (2006.01) |

(52) U.S. Cl.
CPC ............ *H05K 3/423* (2013.01); *H01L 21/2885* (2013.01); *H01L 21/486* (2013.01); *H01L 21/76898* (2013.01); *H01L 23/147* (2013.01); *H01L 23/15* (2013.01); *H01L 23/481* (2013.01); *H01L 23/49827* (2013.01); *H01L 21/76847* (2013.01); *H01L 2924/0002* (2013.01); *H05K 1/0306* (2013.01); *H05K 2201/09563* (2013.01); *H05K 2203/1476* (2013.01); *H05K 2203/1572* (2013.01)

(58) Field of Classification Search
CPC .............................. H05K 1/115; H05K 1/116
USPC .................. 174/262, 263, 264, 265, 266, 261
See application file for complete search history.

(56) References Cited

U.S. PATENT DOCUMENTS

| | | | | |
|---|---|---|---|---|
| 6,016,012 A * | 1/2000 | Chatila | ............. | H01L 21/76843 257/753 |
| 6,716,737 B2 * | 4/2004 | Plas | .................. | H01L 21/76898 257/E21.597 |
| 6,844,241 B2 * | 1/2005 | Halahan | ............ | H01L 21/76898 257/E21.597 |
| 7,067,353 B2 | 6/2006 | Koizumi et al. | | |
| 7,749,899 B2 * | 7/2010 | Clark | ................ | H01L 21/76898 257/E21.585 |
| 8,729,407 B2 * | 5/2014 | Mori | ...................... | H05K 3/425 174/262 |

(Continued)

FOREIGN PATENT DOCUMENTS

JP      2005-011987      1/2005

*Primary Examiner* — Michael F McAllister
(74) *Attorney, Agent, or Firm* — IPUSA, PLLC

(57) ABSTRACT

A wiring board includes a substrate body provided with a through hole penetrating the substrate body from one surface to another surface; and a through wiring formed in the through hole and including a first metal layer formed on a part of an inner side surface of the through hole at the one surface side, a first wiring layer that covers the first metal layer to fill a part of the through hole at the one surface side, a second metal layer continuously formed on the rest part of the inner side surface of the through hole at the other surface side and on an end portion of the first wiring layer at the other surface side, and a second wiring layer that covers the second metal layer to fill a part of the through hole at the other surface side.

6 Claims, 5 Drawing Sheets

(56) References Cited

U.S. PATENT DOCUMENTS

| | | | |
|---|---|---|---|
| 2004/0016114 A1* | 1/2004 | McAllister et al. | 29/830 |
| 2006/0144618 A1* | 7/2006 | Song | H05K 3/423 174/266 |
| 2006/0289968 A1* | 12/2006 | Sulfridge | H01L 21/288 257/621 |
| 2007/0032061 A1* | 2/2007 | Farnworth | H01L 21/76898 438/597 |
| 2007/0199736 A1* | 8/2007 | Wang | H05K 1/0222 174/266 |
| 2008/0149977 A1* | 6/2008 | Nakamura | H01L 27/11507 257/295 |
| 2011/0120762 A1* | 5/2011 | Kawai | H05K 3/423 174/264 |
| 2011/0155439 A1* | 6/2011 | Yamada | 174/264 |
| 2012/0168220 A1* | 7/2012 | Lee | H05K 3/429 174/264 |

\* cited by examiner

WIRING BOARD WITH THROUGH WIRING

CROSS-REFERENCE TO RELATED APPLICATION

The present application is based on and claims the benefit of priority of Japanese Priority Application No. 2013-200631 filed on Sep. 26, 2013, the entire contents of which are hereby incorporated by reference.

BACKGROUND OF THE INVENTION

1. Field of the Invention

The present invention relates to a wiring board.

2. Description of the Related Art

Conventionally, in order to form a through wiring in a silicon substrate, a bottom-up plating process using a conductive layer as an electrode has been used, for example. Specifically, first, a film conductive layer is formed at a lower side of the silicon substrate. Then, copper (Cu) is deposited in a through hole provided in the silicon substrate by electrolytic plating process using the conductive layer as a seed layer (see Patent Document 1, for example).

However, in such a method, the copper (Cu) deposited in the through hole just contacts an inner side surface of the through hole but does not adhere to the inner side surface. Thus, when the silicon substrate is repeatedly used in high temperature environment or low temperature environment, pumping phenomenon of copper (expansion and contraction due to temperature variation) is generated due to the difference between coefficients of thermal expansion of silicon and copper. Then, copper is removed from the inner side surface of the through hole to cause a conductive failure of the through wiring.

In order to solve such a problem, a method of forming a through wiring is known in which an insulating layer is formed on a surface of a silicon substrate including an inner side surface of a through hole, a seed layer whose adhesion to the insulating layer is good is formed on the surface of the silicon substrate including the inner side surface of the through hole, and then the through wiring is formed in the through hole by filling plating. With this method, the pumping phenomenon of the copper may be suppressed and the likelihood that the copper is removed from the inner side surface of the through hole to cause the conductive failure of the through wiring can be reduced. However, there is a problem in that the likelihood of generation of a defect such as a seam, a void, or the like, in the through wiring is increased. The likelihood of such generation of the defect becomes high when the aspect ratio of the through hole becomes high.

PATENT DOCUMENT

[Patent Document 1] Japanese Laid-open Patent Publication No. 2005-11987

SUMMARY OF THE INVENTION

The present invention is made in light of the above problems, and provides a wiring board or the like in which conductive failure of a through wiring is suppressed and generation of defect such as a seam, a void or the like in the through wiring is also suppressed.

According to an embodiment, there is provided a wiring board including a substrate body provided with a through hole penetrating the substrate body from one surface to another surface of the substrate body; and a through wiring formed in the through hole and including a first metal layer that is formed on a part of an inner side surface of the through hole at the one surface side, a first wiring layer that covers the first metal layer to fill a part of the through hole at the one surface side, a second metal layer that is continuously formed on the rest part of the inner side surface of the through hole at the other surface side and on an end portion of the first wiring layer at the other surface side, and a second wiring layer that covers the second metal layer to fill a part of the through hole at the other surface side, the first wiring layer and the second wiring layer being electrically connected in the through hole via the second metal layer.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
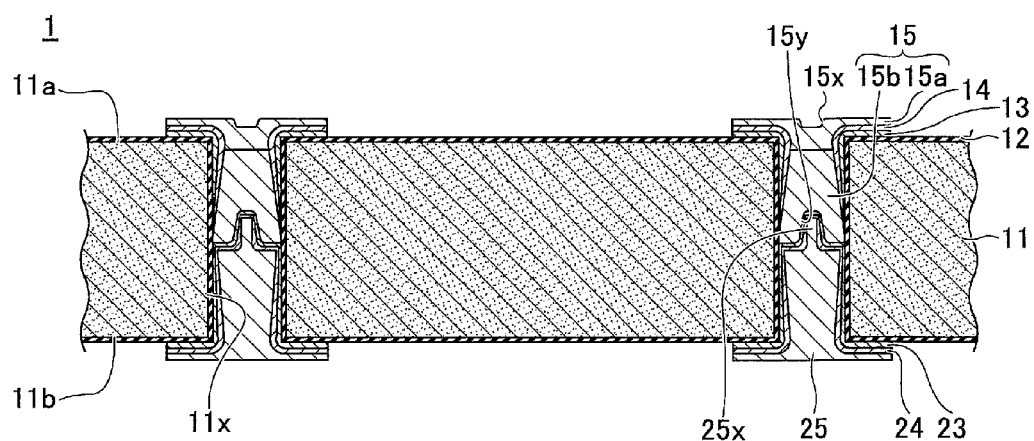
FIG. 1 is a cross-sectional view illustrating an example of a wiring board of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Board of First Embodiment

First, a structure of a wiring board 1 of the first embodiment is explained. FIG. 1 is a cross-sectional view illustrating an example of the wiring board 1 of the first embodiment. With reference to FIG. 1, the wiring board 1 includes a substrate body 11, an insulating layer 12, a first adhesion layer 13, a first metal layer 14, a first wiring layer 15, a second adhesion layer 23, a second metal layer 24 and a second wiring layer 25.

In this embodiment, a first wiring layer 15 side is referred to as an upper side or one side, and a second wiring layer 25 side is referred to as a lower side or the other side. Further, a surface of each components at the first wiring layer 15 side is referred to as an upper surface or one surface, and a surface at the second wiring layer 25 side is referred to as a lower surface or the other surface. However, the wiring board 1 may be used in an opposite direction or may be used at an arbitrarily angle. Further, in this embodiment, "in a plan view" means that an object is seen in a direction that is normal to one surface 11a of the substrate body 11, and a "plan shape" means a shape of an object seen in the direction that is normal to the one surface 11a of the substrate body 11.

The substrate body 11 is a base portion for forming the first wiring layer 15 and the like in the wiring board 1 and the substrate body 11 is provided with through holes 11x. The thickness of the substrate body 11 may be about 100 to 200 µm, for example. For the material of the substrate body 11, silicon, glass, resin or the like may be used.

By mounting a semiconductor chip on the wiring board 1, a semiconductor package can be obtained. In such a case, as many of semiconductor chips include a silicon substrate, for the material of the substrate body 11, silicon, or borosilicate glass whose coefficient of thermal expansion is close to that of silicon may be used, in viewpoint of conforming coefficients of thermal expansion. The borosilicate glass is a glass containing boric acid ($B_2O_3$) and silic acid ($SiO_2$) as a main constituent and having a coefficient of thermal expansion about 3 ppm/° C. Further, in viewpoint of processability, silicon may be used for the material of the substrate body 11.

The reason for conforming the coefficient of thermal expansion of the substrate body 11 with the coefficient of thermal expansion of the semiconductor chip is to reduce thermal stress generated at a contacting portion of the wiring board 1 and the semiconductor chip in both high temperature environment and low temperature environment. Hereinafter, in this embodiment, an example in which the material for the substrate body 11 is silicon is explained.

Each of the through holes 11x is a so-called through silicon via (TSV) that is provided to penetrate the one surface 11a to the other surface 11b of the substrate body 11. Each of the through holes 11x has a substantially circular shape in a plan view, for example. The diameter of the through hole 11x may be about 20 to 40 µm, for example. Although two through holes 11x are illustrated in FIG. 1, the number of through holes 11x provided in the substrate body 11 may be arbitrarily determined.

The insulating layer 12 is formed to continuously cover the one surface 11a and the other surface 11b of the substrate body 11 and the inner side surfaces of the through holes 11x. The insulating layer 12 is provided to electrically insulate the substrate body 11 from the first adhesion layer 13, the first metal layer 14, the first wiring layer 15, the second adhesion layer 23, the second metal layer 24 and the second wiring layer 25. For the insulating layer 12, silicon oxide film ($SiO_2$ film) may be used, for example. The thickness of the silicon oxide film may be about 1 to 2 µm, for example.

The first adhesion layer 13 is formed on the one surface 11a of the substrate body 11 at a position around each of the through holes 11x and further extends on the inner side surface of each of the through holes 11x, via the insulating layer 12. In each of the through holes 11x, the first adhesion layer 13 is stacked on the inner side surface of the through hole 11x at about a half portion of the inner side surface at the one surface 11a side, via the insulating layer 12. The first adhesion layer 13 is made of a material whose adhesion to the insulating layer 12 is better than that of the first metal layer 14. The thickness of the first adhesion layer 13 that is formed on the one surface 11a of the substrate body 11 is about 0.2 to 5 µm, for example. The thickness of the first adhesion layer 13 that is formed on the inner side surface of each of the through holes 11x may become thinner as it approaches a deeper portion of the through hole 11x from the one surface 11a side of the substrate body 11.

The first metal layer 14 is stacked on the first adhesion layer 13. In other words, the first adhesion layer 13 is formed between the substrate body 11 and the first metal layer 14. A front end portion of the first metal layer 14 may be directly formed on the insulating layer 12, without interposing the first adhesion layer 13, in the vicinity of the center portion of the inner side surface of the through hole 11x.

The material of the first metal layer 14 may be copper (Cu), for example. The thickness of the first metal layer 14 that is stacked on the first adhesion layer 13 on the one surface 11a of the substrate body 11 may be about 0.2 to 5 µm, for example. The thickness of the first metal layer 14 that is formed at the inner side surface of the through hole 11x may become thinner as it approaches a deeper portion in the through hole 11x from the one surface 11a side of the substrate body 11.

The material for the first adhesion layer 13 may be titanium (Ti), tantalum (Ta), chromium (Cr), titanium tungsten (TiW) or the like, whose adhesion to the silicon oxide film is better than that of copper, for example. When the material for the substrate body 11 is silicon, the insulating layer 12 is a silicon oxide film and the material for the first metal layer 14 is copper (Cu), adhesion between the silicon oxide film and copper is not good. However, by providing the first adhesion layer 13 made of the above described material, the silicon oxide and copper can be appropriately adhered with each other via the first adhesion layer 13.

The first wiring layer 15 has a stacked structure of a second conductive layer 15b and a first conductive layer 15a at the one surface 11a side of the substrate body 11. The first wiring layer 15 includes a pad portion having a plan shape of a substantially circular shape formed on and around each of the through holes 11x on the one surface 11a of the substrate body 11, for example. The first wiring layer 15 may include a pattern portion that is patterned into a predetermined shape on the one surface 11a of the substrate body 11 in addition to the pad portions. The first wiring layer 15 formed in each of the through holes 11x covers the first metal layer 14 to fill the one surface 11a side of the through hole 11x.

The first conductive layer 15a is formed on the first metal layer 14 at the one surface 11a side of the substrate body 11 to fill one end side (the one surface 11a side) of the through hole 11x. The first conductive layer 15a is provided with a concave portion 15x. For the material of the first conductive layer 15a, copper (Cu) or the like may be used, for example. The thickness of the first conductive layer 15a that is formed on the one surface 11a of the substrate body 11 may be about 5 to 30 µm, for example.

The second conductive layer 15b is formed on the first metal layer 14 at the inner side surface of the through hole 11x such that to fill about a half portion of the through hole 11x at the upper side. In other words, the second conductive layer 15b contacts a lower end surface of the first conductive layer 15a and is formed to fill about a half portion of the through hole 11x at the one surface 11a. The second conductive layer 15b is provided with a concave portion 15y at an end portion at the other surface 11b side open to the other surface 11b side. For the material of the second conductive layer 15b, copper (Cu) or the like may be used, for example. Further, a front end portion of the second conductive layer 15b may be directly formed on the insulating layer 12 without interposing the first adhesion layer 13 and the first metal layer 14 in the vicinity of the center portion of the inner side surface of the through hole 11x.

The second adhesion layer 23 is formed on the other surface 11b at a position around each of the through holes 11x and further extends on the inner side surface of each of the through holes 11x, via the insulating layer 12. In each of the through holes 11x, the second adhesion layer 23 is stacked on the inner side surface of the through hole 11x at about a half portion at the lower side via the insulating layer 12. The second adhesion layer 23 further extends to stack on a lower end surface of the second conductive layer 15b including the inner side surface and the inner bottom surface of the concave portion 15y. The second adhesion layer 23 is made of a material whose adhesion to the insulating layer 12 is better than that of the second metal layer 24. The thickness of the second adhesion layer 23 that is formed on the other surface 11b of the substrate body 11 may be about 0.2 to 5 μm, for example. The thickness of the second adhesion layer 23 that is formed on the inner side surface of the through hole 11x may become thinner as it approaches a deeper portion of the through hole 11x from the other surface 11b side of the substrate body 11. The second adhesion layer 23 and the first adhesion layer 13 are not directly connected (not in contact with each other).

The second metal layer 24 is stacked on the second adhesion layer 23. In other words, the second adhesion layer 23 is formed between the substrate body 11 and the second metal layer 24, and between an end portion of the first wiring layer 15 at the other surface 11b side and the second metal layer 24. A front end portion of the second metal layer 24 may be directly formed on the insulating layer 12, without intervening the second adhesion layer 23, in the vicinity of the center portion of the inner side surface of the through hole 11x.

The material of the second metal layer 24 may be copper (Cu), for example. The thickness of the second metal layer 24 that is stacked on the second adhesion layer 23 on the other surface 11b of the substrate body 11 may be about 0.2 to 5 μm, for example. The thickness of the second metal layer 24 formed at the inner side surface of the through hole 11x may become thinner as it approaches a deeper portion of the through hole 11x from the other surface 11b side of the substrate body 11.

The material for the second adhesion layer 23 may be titanium (Ti), tantalum (Ta), chromium (Cr), titanium tungsten (TiW) or the like, whose adhesion to the silicon oxide film is better than that of copper, for example. When the material for the substrate body 11 is silicon, the insulating layer 12 is a silicon oxide film and the material for the second metal layer 24 is copper (Cu), adhesion between the silicon oxide film and copper is not good. However, by providing the second adhesion layer 23 made of the above described material, the silicon oxide film and copper can be appropriately adhered with each other via the second adhesion layer 23.

The second wiring layer 25 is formed on the other surface 11b side of the substrate body 11. The second wiring layer 25 includes a pad portion having a plan shape of a substantially circular shape formed on and around each of the through holes 11x on the other surface 11b of the substrate body 11, for example. The second wiring layer 25 may include a pattern portion that is patterned into a predetermined shape on the other surface 11b of the substrate body 11 in addition to the pad portions. The second wiring layer 25 formed in the through hole 11x covers the second metal layer 24 to fill other surface 11b side of the through hole 11x.

Specifically, the second wiring layer 25 is formed on the second metal layer 24 and extends in the through hole 11x from the other surface 11b of the substrate body 11 to fill about a half portion of the through hole 11x at the lower side. For the material of the second wiring layer 25, copper (Cu) or the like may be used, for example. The thickness of the second wiring layer 25 formed on the other surface 11b of the substrate body 11 may be about 5 to 30 μm, for example.

The second wiring layer 25 is electrically connected to the first wiring layer 15 via the second adhesion layer 23 and the second metal layer 24 in each of the through holes 11x. Here, the first wiring layer 15 and the second wiring layer 25 provided in each of the through holes 11x is referred to as a through wiring. The second wiring layer 25 is provided with a protruding portion 25x at an end portion at the one surface 11a side (at the first wiring layer 15 side) protruding toward the one surface 11a side. The protruding portion 25x fits in the concave portion 15y. As the protruding portion 25x fits in the concave portion 15y to form a caulking status in each of the through holes 11x, and contacting area between the first wiring layer 15 and the second wiring layer 25 in each of the through holes 11x via the second adhesion layer 23 and the second metal layer 24 becomes large, the first wiring layer 15 and the second wiring layer 25 are bonded with a high intensity.

(Method of Manufacturing Wiring Board of First Embodiment)

Next, a method of manufacturing the wiring board 1 of the first embodiment is explained. FIG. 2A to FIG. 5 are views illustrating an example of manufacturing steps of the wiring board 1 of the first embodiment. In FIG. 2A to FIG. 5, a peripheral portion of the wiring board 1 around one of the through holes 11x is exemplified in an enlarged manner.

Figure 2A:
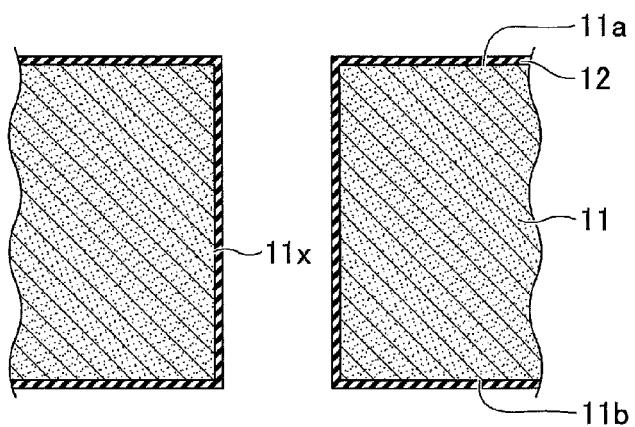
FIG. 2A to FIG. 2C are views illustrating an example of manufacturing steps of the wiring board of the first embodiment.

First, in a step illustrated in FIG. 2A, the substrate body 11 is prepared. Then, the through holes 11x each penetrating the one surface 11a to the other surface 11b of the substrate body 11 are formed. Thereafter, the insulating layer 12 is formed on the entire surface of the substrate body 11 including the inner side surfaces of the through holes 11x. For the substrate body 11, a silicon wafer having a size of 6 inches (about 150 mm), 8 inches (about 200 mm), 12 inches (about 300 mm) or the like may be used, for example. The thickness of the silicon wafer may be 0.625 mm (for 6 inches size), 0.725 mm (for 8 inches size), 0.775 mm (for 12 inches size) or the like. However, the substrate body 11 may be made thinner (100 to 200 μm, for example) by a backside grinder or the like.

The through holes 11x may be formed by forming a resist layer (not illustrated in the drawings) provided with openings corresponding to the through holes 11x, and etching the substrate body 11 using the resist layer (not illustrated in the drawings) as a mask. For the etching, anisotropic etching such as Deep Reactive Ion Etching (DRIE) using $SF_6$ (sulfur hexafluoride), for example, may be used. The plan shape of the through hole 11x may be a circular shape having a diameter of about 20 to 40 μm, for example. When the diameter of the through hole 11x is 20 μm and the thickness of the substrate body 11 is 200 μm, the aspect ratio (ratio of the depth with respect to the diameter) of the through hole 11x is 10, for example.

For the insulating layer 12, a silicon oxide film ($SiO_2$ film) may be used, for example. The silicon oxide film may be formed by thermally oxidizing the surface of the substrate body 11 by a wet thermal oxidation method in which the surface of the substrate body 11 is heated to more than or equal to 1000° C., for example. The thickness of the silicon oxide film may be about 1 to 2 μm, for example.

Figure 2B:
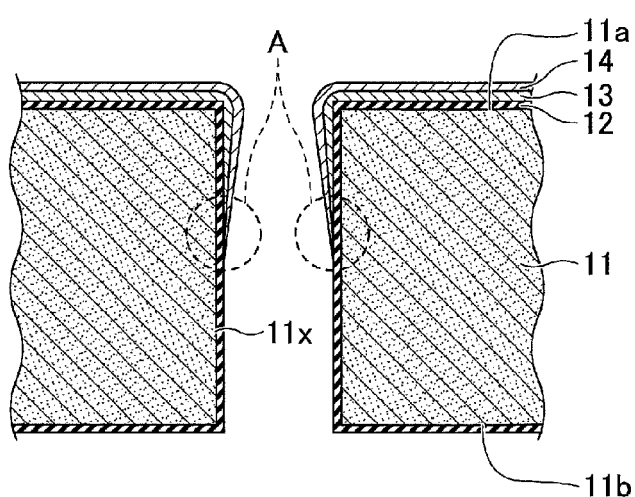

Next, in a step illustrated in FIG. 2B, the first adhesion layer 13 and the first metal layer 14 are formed in this order from the one surface 11a side of the substrate body 11 by sputtering or the like, for example. The first adhesion layer 13 and the first metal layer 14 are stacked on the one surface 11a of the substrate body 11 and further extend on the inner side surface of each of the through holes 11x, via the insulating layer 12. In each of the through holes 11x, the first adhesion layer 13 and the first metal layer 14 are formed such that the first adhesion layer 13 and the first metal layer 14 exist at about a half portion of the through hole 11x at the upper side on the inner side surface of the through hole 11x via the insulating layer 12. Further, a front end portion of the first metal layer 14 may be directly formed on the insulating layer 12, without intervening the first adhesion layer 13, at an area A that is in the vicinity of the center portion of the inner side surface of the through hole 11x.

When the insulating layer 12 is silicon oxide film and the material of the first metal layer 14 is copper (Cu), for the material of the first adhesion layer 13, titanium (Ti), tantalum (Ta), chromium (Cr), titanium tungsten (TiW) or the like may be used, for example. The thickness of the first adhesion layer 13 that is formed on the one surface 11a of the substrate body 11 may be about 0.2 to 5 µm, for example. The thickness of the first metal layer 14 that is stacked on the first adhesion layer 13 on the one surface 11a of the substrate body 11 may be about 0.2 to 5 µm, for example. When the insulating layer 12 is silicon oxide film and the material of the first metal layer 14 is copper (Cu), adhesion between the silicon oxide film and copper is not good. However, by forming the first adhesion layer 13 by titanium (Ti) or the like, the silicon oxide film and copper can be appropriately adhered via the first adhesion layer 13.

Figure 2C:
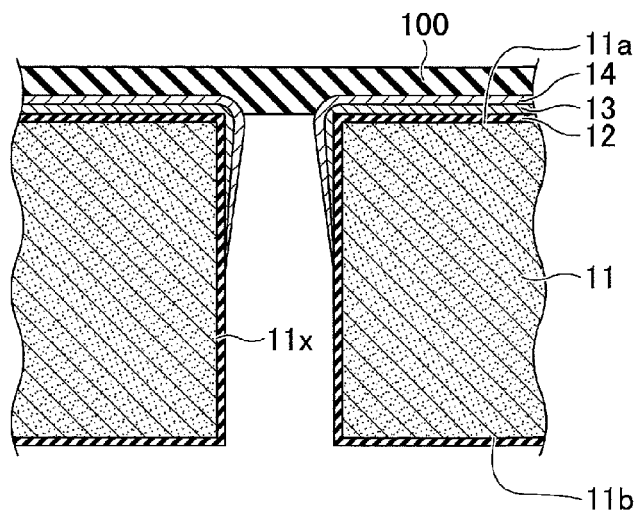

Next, in a step illustrated in FIG. 2C, a protection film 100 is laminated on the one surface 11a of the substrate body 11 via the first adhesion layer 13 and the first metal layer 14 so as to block an end portion of each of the through holes 11x at the one surface 11a side. For the protection film 100, a resin film or the like may be used, for example. Further, a part of the protection film 100 may protrude in each of the through holes 11x.

Figure 3A:
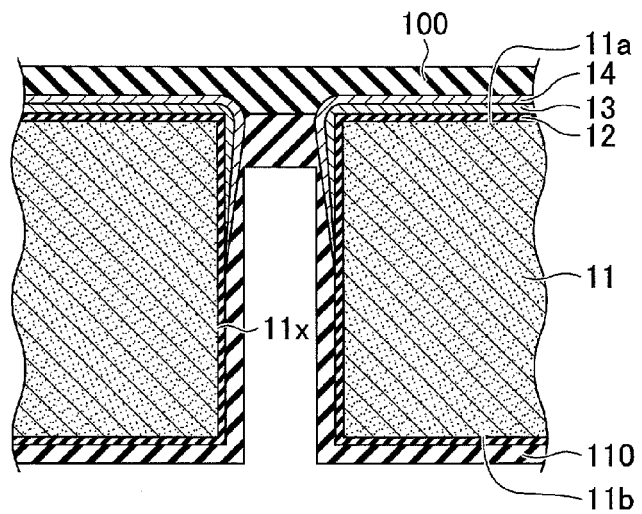
FIG. 3A to FIG. 3C are views illustrating an example of manufacturing steps of the wiring board of the first embodiment.

Next, in a step illustrated in FIG. 3A, from the other surface 11b side of the substrate body 11, liquid resin or the like is coated on the other surface 11b of the substrate body 11 and in the through holes 11x by a spin coat method, a spray coat method or the like, for example. Then the liquid resin or the like is cured by heating at a predetermined temperature. With this operation, a resist layer 110 is formed that continuously covers the inner side surface of each of the through holes 11x at the other surface 11b side, the first metal layer 14 and a portion of the protection film 100 that is exposed in the through hole 11x. Alternatively, the resist layer 110 may be formed to fill the through holes 11x.

Figure 3B:
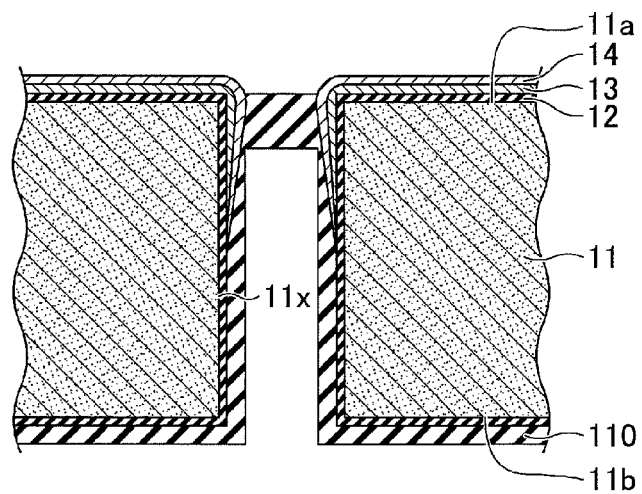

Next, in a step illustrated in FIG. 3B, the protection film 100 is removed to expose a portion of the resist layer 110 from an end portion of each of the through holes 11x at the one surface 11a side. The protection film 100 may be removed by dissolving with organic solvent that can selectively dissolve the protection film 100 and does not dissolve the resist layer 110, for example. Alternatively, the protection film 100 may be mechanically peeled or the like, for example.

Figure 3C:
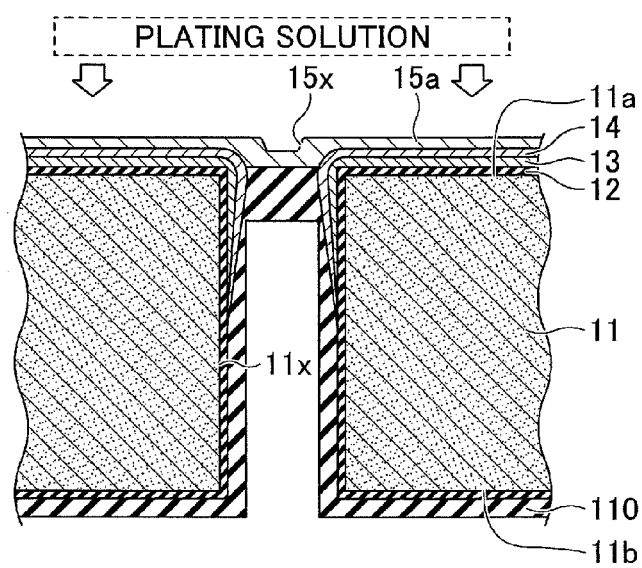

Next, in a step illustrated in FIG. 3C, the first conductive layer 15a, that is a part of the first wiring layer 15, is formed on the first metal layer 14 and the portion of the resist layer 110 that is exposed from the end portion of each of the through holes 11x at the one surface 11a. The first conductive layer 15a may be formed by electrolytic plating in which plating solution is supplied from the one surface 11a side of the substrate body 11 and using the first metal layer 14 as a power supply layer, for example. For the material of the first conductive layer 15a, copper (Cu) or the like may be used, for example. The thickness of the first conductive layer 15a that is formed on the one surface 11a of the substrate body 11 may be about 5 to 30 µm, for example. As the first conductive layer 15a isotropically grows from the first metal layer 14 by conformal plating, the first conductive layer 15a is provided with the concave portion 15x at an upper portion of an area overlapping each of the through holes 11x, in a plan view.

Figure 4A:
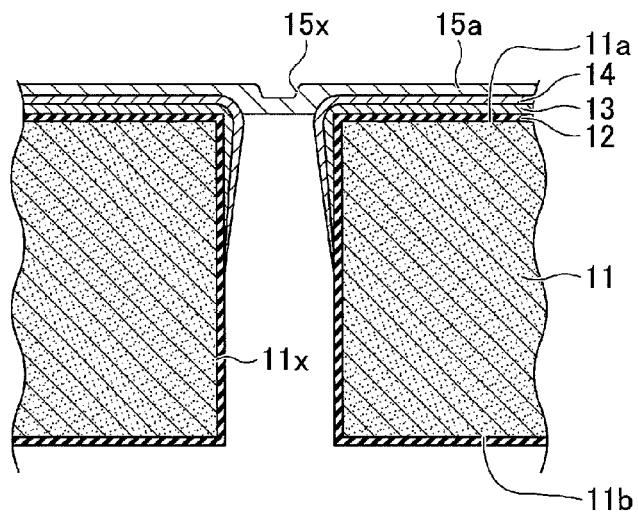
FIG. 4A to FIG. 4C are views illustrating an example of manufacturing steps of the wiring board of the first embodiment.

Next, in a step illustrated in FIG. 4A, the resist layer 110 is removed. The resist layer 110 may be removed by dissolving with organic solvent, for example.

Figure 4B:
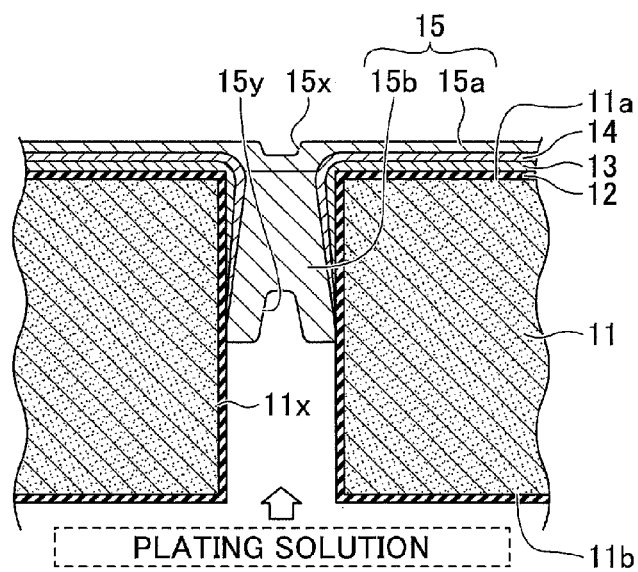

Next, in a step illustrated in FIG. 4B, the second conductive layer 15b, that is also a part of the first conductive layer 15a, is formed on the first conductive layer 15a at the other surface 11b side such that to fill the one surface 11a of each of the through holes 11x. The second conductive layer 15b may be formed by electrolytic plating in which plating solution is supplied from the other surface 11b side of the substrate body 11 and using the first metal layer 14 as a power supply layer. For the material of the second conductive layer 15b, copper (Cu) or the like may be used, for example. The second conductive layer 15b is formed to fill about a half portion of each of the through holes 11x at the upper side. As the second conductive layer 15b isotropically grows from the first metal layer 14 by conformal plating, in each of the through holes 11x, the second conductive layer 15b is provided with a concave portion 15y at an end portion at the other surface 11b side open to the other surface 11b side. Further, a front end portion of the second conductive layer 15b may be directly formed on the insulating layer 12 without intervening the first adhesion layer 13 and the first metal layer 14 in the vicinity of the center portion of the inner side surface of the through hole 11x. With this step, the first wiring layer 15 that covers the first metal layer 14 and fills the one surface 11a side of each of the through holes 11x is formed.

Figure 4C:
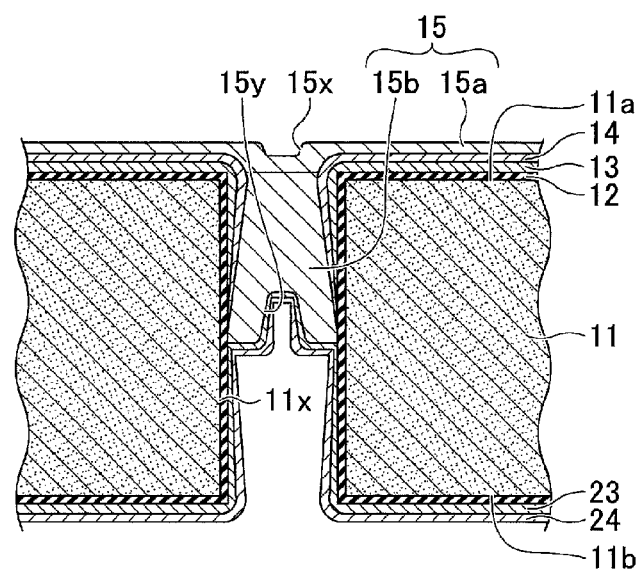

Next, in a step illustrated in FIG. 4C, the second adhesion layer 23 and the second metal layer 24 are formed in this order from the other surface 11b side of the substrate body 11 by sputtering or the like, for example. The second adhesion layer 23 and the second metal layer 24 are stacked on the other surface 11b of the substrate body 11 and further extend on the inner side surface of each of the through holes 11x, via the insulating layer 12. In each of the through holes 11x, the second adhesion layer 23 and the second metal layer 24 are formed such that the second adhesion layer 23 and the second metal layer 24 exist at about a half portion of the through hole 11x at the lower side on the insulating layer 12. Further, the second adhesion layer 23 and the second metal layer 24 further extend to be continuously stacked on the lower end surface of the second conductive layer 15b including the inner side surface and the inner bottom surface of the concave portion 15y formed at the end portion of the first wiring layer 15 at the other surface 11b side. The second adhesion layer 23 and the first adhesion layer 13 do not directly connected (not in contact with each other).

The materials, the thicknesses and the like of the second adhesion layer 23 and the second metal layer 24 may be the same as those of the first adhesion layer 13 and the first metal layer 14, for example. When the insulating layer 12 is a silicon oxide film and the material of the second metal layer 24 is copper (Cu), adhesion between the silicon oxide film and copper is not good. Thus, by providing the second adhesion layer 23 made of titanium (Ti) or the like, the silicon oxide film and copper can be appropriately adhered with each other via the second adhesion layer 23.

Figure 5:
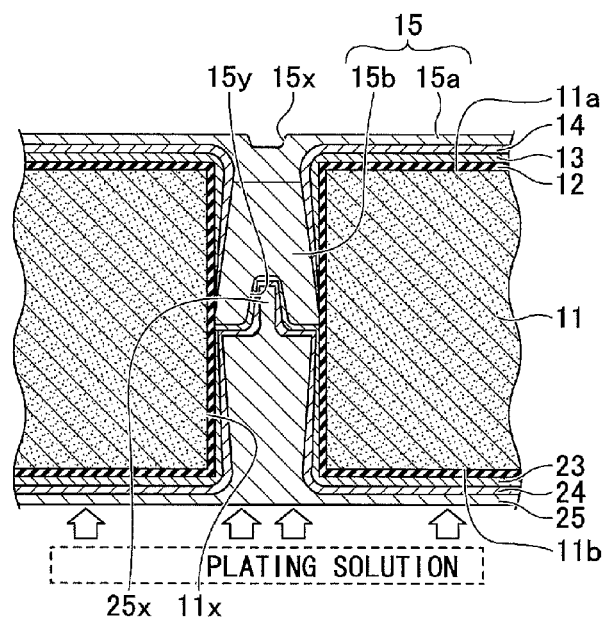
FIG. 5 is a view illustrating an example of a manufacturing step of the wiring board of the first embodiment.

Next, in a step illustrated in FIG. 5, the second wiring layer 25 is formed on a lower side of the second conductive layer 15b by electrolytic plating in which plating solution is supplied from the other surface 11b side of the substrate body 11 and using the second metal layer 24 as a power supply layer, for example. The second wiring layer 25 is formed to cover the second adhesion layer 23 and the second metal layer 24 and fill the other surface 11b side of each of the through holes 11x (about a half portion of the through hole 11x at the lower side). The second wiring layer 25 is electrically connected to the first wiring layer 15 via the second adhesion layer 23 and the second metal layer 24. Here, in each of the through holes 11x, the second wiring layer 25 is provided with a protruding portion 25x at an end portion at the one surface 11a side protruding toward the one surface 11a side. The protruding portion 25x fits in the concave portion 15y. Thereafter, the first wiring layer 15 and the second wiring layer 25 are patterned into predetermined plan shapes by a subtractive process or the like, and the silicon wafer (the substrate body 11) is divided into chips to obtain the wiring board 1 as illustrated in FIG. 1.

As such, according to the wiring board 1 of the first embodiment, the first metal layer 14 made of copper, for example, is adhered to the inner side surface of the through hole 11x via the first adhesion layer 13. Further, the second metal layer 24 made of copper, for example, is adhered to the inner side surface of the through hole 11x via the second adhesion layer 23. Thus, even when the wiring board 1 is repeatedly used in high temperature environment or low temperature environment, pumping phenomenon (expansion and contraction due to temperature variation) of copper can be suppressed compared with the conventional structure. Thus, the likelihood that the metal layers 14 and 24 are removed from the inner side surface of the through hole 11x to cause the conductive failure of the through wiring can be reduced.

Further, as the protruding portion 25x of the second wiring layer 25 fits in the concave portion 15y of the first wiring layer 15 to form a caulking status in each of the through holes 11x, and contacting area between the first wiring layer 15 and the second wiring layer 25 in each of the through holes 11x via the second adhesion layer 23 and the second metal layer 24 becomes large, the first wiring layer 15 and the second wiring layer 25 are bonded with a high intensity. Thus, even when the pumping phenomenon of the copper slightly occurs, the likelihood that the metal layers 14 and 24 are removed from the inner side surface of the through hole 11x to cause the conductive failure of the through wiring can be reduced.

Further, there may be a case in which the first adhesion layer 13 and the first metal layer 14 are formed at the one surface 11a of the substrate body 11 via an insulating layer such as polyimide or the like. In such a case, there is a problem that a crack is generated at a portion of the insulating layer such as polyimide or the like that contacts copper (Cu) due to the pumping phenomenon of copper. However, in this embodiment, as the pumping phenomenon of copper can be suppressed, the likelihood of the generation of the crack at the portion of the insulating layer such as polyimide or the like that contacts copper (Cu) can be reduced. This is the same for the case when forming the second adhesion layer 23 and the second metal layer 24 on the other surface 11b of the substrate body 11 via an insulating layer such as polyimide or the like.

Further, the first wiring layer 15 and the second wiring layer 25, which are formed in different plating steps, compose the through wiring formed in the through hole 31x. In other words, the through wiring that is necessarily formed by a single plating step is about a half of the depth of the through hole 11x. Thus, it is easy to fill plating metal in a through hole 11x with a high aspect ratio (through hole whose aspect ratio is 10, for example) to form a through wiring without defect such as a seam, a void or the like. This means that the actual aspect ratio can be made half according to the method of manufacturing the through wiring of the embodiment.

Second Embodiment

In the second embodiment, an example is explained in which a base member including resin as a main constituent is used as the substrate body. It is to be noted that, in the explanation of the drawings, the same components are given the same reference numerals, and explanations are not repeated.

Figure 6:
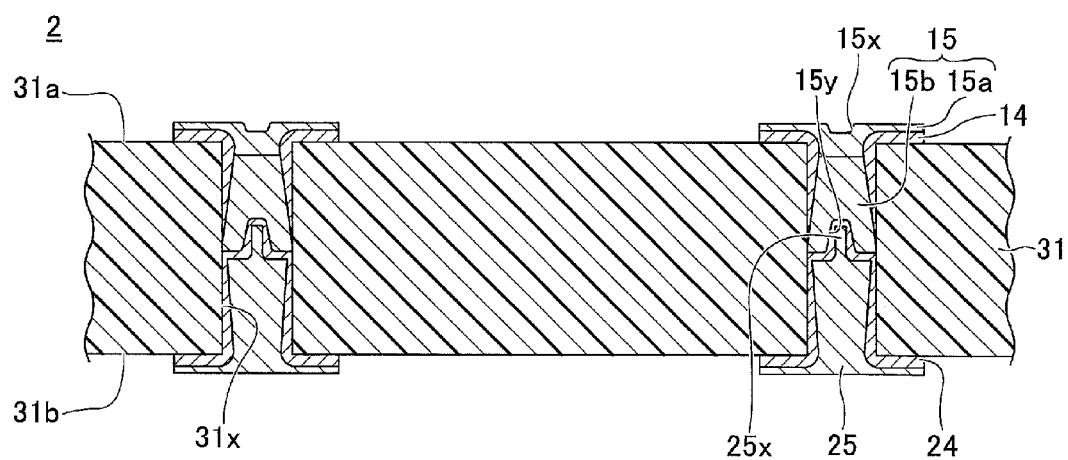
FIG. 6 is a cross-sectional view illustrating an example of a wiring board of a second embodiment.

FIG. 6 is a cross-sectional view illustrating an example of a wiring board 2 of the second embodiment. With reference to FIG. 6, the wiring board 2 is different from the wiring board 1 (see FIG. 1) in that the substrate body 11 is substituted by a substrate body 31.

The substrate body 31 is a base member obtained by impregnating a glass cloth base member in epoxy resin, for example. The thickness of the substrate body 31 may be about 0.2 to 1.6 mm, for example. As the substrate body 31 is an insulating material, the insulating layer 12 is not formed on surfaces of the substrate body 31.

Further, the first adhesion layer 13 is not provided and the first metal layer 14 made of copper is directly formed on one surface 31a of the substrate body 31 and on an inner wall surface of each through hole 31x. Further, the second adhesion layer 23 is not provided, and the second metal layer 24 made of copper is directly formed on another surface 31b of the substrate body 31 and on an inner wall surface of each of the through holes 31x. As the metal layers 14 and 24 made of copper adhere relatively well to the substrate body 31 that is the base member including the resin as a main constituent, the first adhesion layer 13 and the second adhesion layer 23 are not provided.

In order to manufacture the wiring board 2, first, a base member including resin as a main constituent is prepared as the substrate body 31. Then, the through holes 31x are formed in the substrate body 31 by drilling, laser processing or the like. Thereafter, steps similar to those explained with reference to FIG. 2B to FIG. 5 in the first embodiment are performed. Here, the steps of forming the insulating layer 12, the first adhesion layer 13 and the second adhesion layer 23 are unnecessary in this embodiment.

As such, the base member including resin as a main constituent may be used as the substrate body instead of silicon. In this case, the metal layers 14 and 24 made of copper and the substrate body 31 that is the base member including resin as a main constituent adhere relatively well with each other. Thus, the pumping phenomenon of copper can be suppressed to a certain extent. However, by the structure providing the protruding portion 25x and the concave portion 15y, the pumping phenomenon of copper can be further suppressed. This means that as the protruding portion 25x of the second wiring layer 25 fits in the concave portion 15y of the first wiring layer 15 to form a caulking status in each of the through holes 11x, and contacting area between the first wiring layer 15 and the second wiring layer 25 in each of the through holes 11x via the second metal layer 24 becomes large, the first wiring layer 15 and the second wiring layer 25 are bonded with a high intensity. Thus, even when the pumping phenomenon of the copper slightly occurs, the likelihood that the metal layers 14 and 24 are removed from the inner side surface of the through hole 11x to cause the conductive failure of the through wiring can be reduced.

Further, the first wiring layer 15 and the second wiring layer 25, which are formed in different plating steps, compose the through wiring formed in the through hole 31x. In other words, the through wiring that is necessarily formed by a single plating step is about a half of the depth of the through hole 11x. Thus, it is easy to fill plating metal in a through hole 11x with a high aspect ratio (through hole whose aspect ratio is 10, for example) to form a through wiring without defect such as a seam, a void or the like. This means that the actual aspect ratio can be made half according to the method of manufacturing the through wiring of the embodiment.

According to the embodiments, a wiring board or the like can be provided in which conductive failure of a through wiring is suppressed and generation of defect such as a seam, a void or the like in the through wiring is also suppressed.

Although a preferred embodiment of the wiring board and the method of manufacturing the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications and modifications may be made without departing from the spirit and scope of the present invention.

In the first embodiment, for the material of the substrate body 11, glass may be used instead of silicon, for example. In this case, as the glass is an insulating material, it is unnecessary to form the insulating layer 12.

Further, as explained above, the pumping phenomenon of copper can be suppressed by the first and second embodiments. However, when a metal other than copper is used for the seed layer and the wiring layer, the pumping phenomenon of such a metal can be suppressed. For example, when copper alloy is used for the seed layer and the wiring layer, the pumping phenomenon of copper alloy can be suppressed.

Various aspects of the subject-matter described herein are set out non-exhaustively in the following numbered clauses:

1. A method of manufacturing a wiring board, comprising:
   forming a through hole that penetrates one surface to another surface of a substrate body in the substrate body; and
   forming a through wiring in the through hole, including
   forming a first metal layer on an inner side surface of the through hole at the one surface side,
   forming a first wiring layer on the first metal layer, which fills the one surface side of the through hole by electrolytic plating using the first metal layer as a power supply layer,
   forming a second metal layer on an inner side surface of the through hole at the other surface side and on an end portion of the first wiring layer at the other surface side in a continuous manner, and
   forming a second wiring layer on the second metal layer, which fills the other surface side of the through hole by electrolytic plating using the second metal layer as a power supply layer, the first wiring layer and the second wiring layer being electrically connected with each other via the second metal layer in the through hole.

2. The method of manufacturing the wiring board according to clause 1,
   wherein the forming the first wiring layer includes,
   forming a protection film at the one surface side of the substrate body that blocks the through hole at the one surface side,
   forming a resist layer, from the other surface side, that continuously covers the inner side surface of the through hole, the first metal layer and a portion of the protection film that is exposed in the through hole,
   removing the protection film to expose the resist layer from an end portion of the through hole at the one surface side,
   forming a first conductive layer, from the one surface side, as a part of the first wiring layer on the resist layer exposed at the end portion of the through hole at the one surface side by electrolytic plating using the first metal layer as a power supply layer,
   removing the resist layer to expose the first conductive layer in the through hole, and
   forming a second conductive layer, from the other surface side, as another part of the first wiring layer on the first conductive layer such that to fill the one surface side of the through hole by electrolytic plating using the first metal layer as a power supply layer.

3. The method of manufacturing the wiring board according to clause 2,
   wherein in the forming the first wiring layer, the second conductive layer of the first wiring layer in the through hole is provided with a concave portion that is open toward the other surface side at an end portion at the other surface side by conformal plating, and
   wherein in the forming the second wiring layer, the second wiring layer in the through hole is provided with a protruding portion that protrudes toward the one surface side at an end portion at the one surface side, the protruding portion fitting in the concave portion.

4. The wiring board according to clause 1,
   wherein the first metal layer and the second metal layer are formed by sputtering.

What is claimed is:

1. A wiring board comprising:
   a substrate body provided with a through hole penetrating the substrate body from one surface to another surface of the substrate body; and
   a through wiring formed in the through hole and including
   a first metal layer that is formed on a part of an inner side surface of the through hole at the one surface side,
   a first wiring layer that covers the first metal layer to fill a part of the through hole at the one surface side,
   a second metal layer that is continuously formed on the rest part of the inner side surface of the through hole at the other surface side and on an end portion of the first wiring layer at the other surface side, and
   a second wiring layer that covers the second metal layer to fill a part of the through hole at the other surface side,
   the second metal layer being interposed between the first wiring layer and the second wiring layer to isolate the first wiring layer and the second wiring layer, and the first wiring layer and the second wiring layer being electrically connected in the through hole via the second metal layer.

2. The wiring board according to claim 1,
   wherein the first wiring layer is provided with a concave portion that is open toward the other surface side at the end portion of the first wiring layer at the other surface side in the through hole, and
   wherein the second wiring layer is provided with a protruding portion that protrudes toward the one surface side at an end portion of the second wiring layer at the one surface side in the through hole, the protruding portion fitting in the concave portion.

3. The wiring board according to claim 1,
   wherein the through wiring further includes
   a first adhesion layer provided between the substrate body and the first metal layer, and
   a second adhesion layer provided between the substrate body and the second metal layer, and between the end portion of the first wiring layer at the other surface side and the second metal layer, the first wiring layer and the second wiring layer being electrically connected with each other via the second adhesion layer and the second metal layer in the through hole.

4. The wiring board according to claim 3,
wherein the material of the substrate body is silicon, and an inner side surface of the through hole is covered by a silicon oxide film,
wherein the first adhesion layer is made of material whose adhesion to the silicon oxide film is better than the adhesion of the first metal layer to the silicon oxide film, and
wherein the second adhesion layer is made of material whose adhesion to the silicon oxide film is better than the adhesion of the second metal layer to the silicon oxide film.

5. The wiring board according to claim 1,
wherein the first wiring layer has a structure in which a plurality of conductive layers are stacked on an end portion of the second wiring layer at the one surface side.

6. The wiring board according to claim 1,
wherein the thickness of the first metal layer formed on an inner side surface of the through hole is formed to become thinner as it approaches a deeper portion of the through hole from the one surface side, and
wherein the thickness of the second metal layer formed on an inner side surface of the through hole is formed to become thinner as it approaches a deeper portion of the through hole from the other surface.

\* \* \* \* \*